(12) United States Patent
Slenker

(10) Patent No.: US 6,236,289 B1
(45) Date of Patent: May 22, 2001

(54) BROADBAND MICROWAVE CHOKE WITH A HOLLOW CONIC COIL FILLED WITH POWDERED IRON IN A LEADLESS CARRIER

(76) Inventor: Stephen Amram Slenker, 10 Crabapple La., Chelmsford, MA (US) 01824

( * ) Notice: Subject to any disclaimer, the term of this patent is extended or adjusted under 35 U.S.C. 154(b) by 0 days.

(21) Appl. No.: 09/660,339

(22) Filed: Sep. 14, 2000

(51) Int. Cl.[7] .......................... H01F 27/06; H01F 27/30; H01F 27/24; H01F 17/04; H03H 7/00
(52) U.S. Cl. .......................... 333/181; 333/185; 336/65; 336/92; 336/221; 336/231; 336/233
(58) Field of Search .................... 333/181, 185; 336/15, 65, 67, 92, 98, 177, 231, 233, 221

(56) References Cited

U.S. PATENT DOCUMENTS

| | | | | |
|---|---|---|---|---|
| 2,351,604 | * | 6/1944 | Ferrill, Jr. | 336/180 |
| 2,442,776 | * | 6/1948 | Newkirk | 336/205 |
| 2,547,412 | * | 4/1951 | Salisbury | 455/325 |
| 3,076,947 | * | 2/1963 | Davidson, Jr. | 333/181 |
| 3,812,438 | * | 5/1974 | Hopfer | 333/246 |
| 4,236,127 | * | 11/1980 | Scherba | 333/185 X |
| 5,838,215 | * | 11/1998 | Gu et al. | 333/181 |
| 6,094,110 | * | 7/2000 | Reddy | 333/181 |

* cited by examiner

Primary Examiner—Robert Pascal
Assistant Examiner—Barbara Summons
(74) Attorney, Agent, or Firm—John V. Stewart

(57) ABSTRACT

A thin electrically conductive wire wound into a conical coil 1 with leads from the small and large ends of the coil. The coil is filled with powdered iron 11, and is mounted in a thin-walled, completely non-conductive, leadless carrier 21 for ease of assembly onto a circuit board 15. The small end 4 of the coil is positioned precisely on a micro-strip 17 on the circuit board to provide maximum bandwidth. The coil is held by the carrier at an angle such that the large end of the coil is displaced from the circuit board by a distance D of at least half the radius of the large end of the coil. Attachment of the leads from the small and large ends of the coil to respective contacts on the circuit board is done with minimum lead length, minimum conductive material, and without the use of metallic pads on the carrier, to yield the highest possible frequency response. The coil geometry in combination with the unique characteristics of the carrier virtually eliminates electrical reflections and resonances to yield a broadband choke with exceptional frequency range from 300 kHz to 40 GHz.

18 Claims, 4 Drawing Sheets

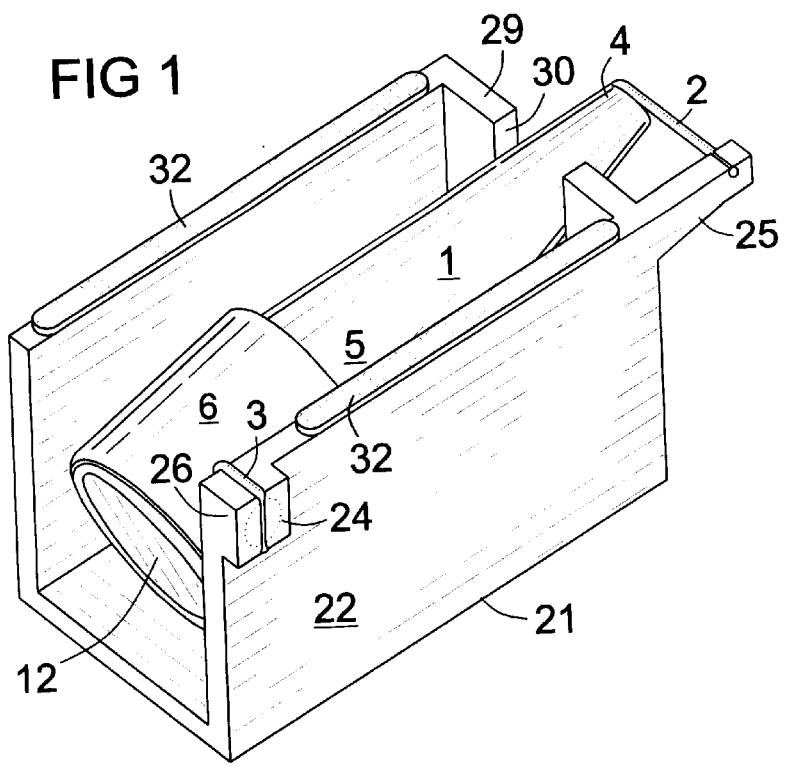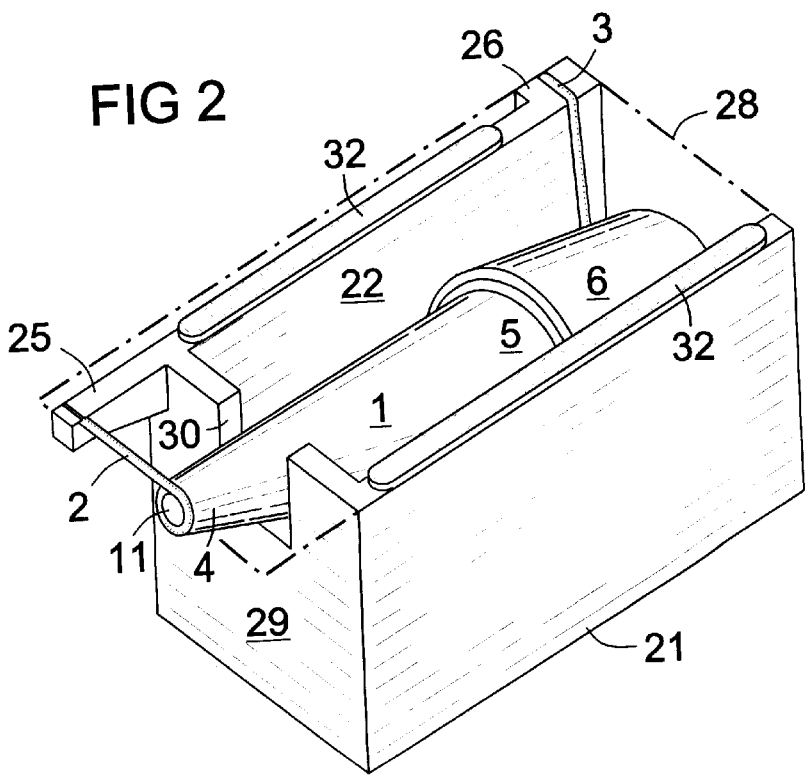

BROADBAND MICROWAVE CHOKE WITH A HOLLOW CONIC COIL FILLED WITH POWDERED IRON IN A LEADLESS CARRIER

BACKGROUND OF THE INVENTION

1. Field of the Invention

This invention relates to microwave chokes for power supplies in electronic amplifiers, signal generators, and filters.

2. Description of Prior Art

Microwave chokes are used to block microwave energy from power supplies in amplifiers, signal generators, and filters. Laser drivers for fiber optic cables also require chokes between their power sources and the lasers. Broadband active filters require broadband chokes. If microwave energy leaks into a power supply, the powered device will not function properly. Microwave chokes typically operate within a narrow band of operating frequencies. However, the fiber optic cables now used in cable television and internet communication typically have extremely large band widths and require amplifiers which will amplify signals for all of the frequencies being transmitted over these cables.

In order to cover the broad spectrum of frequencies, multiple narrow band amplifiers are usually employed, each covering a small segment of the frequency range. These amplifiers are operated in parallel. All of the devices used in these amplifiers would generally function over the entire frequency range except for the chokes. If a broadband choke were available, a single broadband amplifier could replace several narrow-band amplifiers.

Until recently, the highest frequency broadband chokes available would only operate up to 3 or 4 GHz. These chokes generally had a conventional geometry such as a solenoid or a toroid, and used an air, iron, or ferrite core. Beyond this frequency range, multiple small solenoids were typically used, but these devices have a narrow frequency range of about 10% of the center frequency of operation.

Prior leadless carriers for broadband chokes used a ceramic substrate with wraparound connections. However, such a carrier design introduces the dielectric properties of the carrier into the performance of the choke. Additionally the prior carriers have metallic pads for connection of the leads, and these pads add substantial capacitance and dielectric losses. This prior carrier design is marginally useable up to 8 Ghz with the new inductor described herein. However, high frequency performance requires a different approach to the leadless carrier.

SUMMARY OF THE INVENTION

The objectives of the present invention are provision of a wideband microwave choke that attenuates electrical signals in frequencies from 300 kHz to 40 GHz with a substantially flat frequency response in this range, or in a band chosen by design within this range, has a protective, totally non-conductive carrier that assists in precise positioning and bonding of the choke to a miniature conductor strip on a circuit board, takes minimal space along the conductor strip, enables fully automated positioning and mounting of the choke on a circuit board by machine, and provides increased frequency response equal to a leaded, pad-free geometry in a more convenient and easily mountable leadless carrier.

The objectives of the present invention are achieved by a thin, electrically conductive wire 2 wound into a single-layered hollow conic coil 1, having a small end 4 and a large end 5. The coil is mounted in a thin-walled carrier 21 of insulating material such as plastic having no metallic parts. The carrier holds the coil at an optimum orientation relative to the mounting surface of a circuit board to minimize electromagnetic reflections and resonance that would degrade microwave performance. The small end of the coil 4 is positioned adjacent a contact strip 17 on the circuit board, and the wire lead 2 exits tangentially from the small end of the coil and is bonded directly to the contact strip without intermediate metallic pads. An optional cylindrical extension 6 on the large end of the coil provides increased low frequency inductance. The wide range of small to large diameters of coil windings, and careful elimination of sources of electromagnetic interference, reflections, and resonance, provides an inductor that blocks a broad band of radio frequency energy while providing a direct current to pass through the coil unattenuated.

BRIEF DESCRIPTION OF THE DRAWINGS

FIG. 1 is a perspective bottom/right/back view of the choke in a preferred embodiment using a conic coil with a cylindrical extension.

FIG. 2 is a perspective bottom/left/front view of the choke of FIG. 1.

REFERENCE NUMBERS

Figure 3:
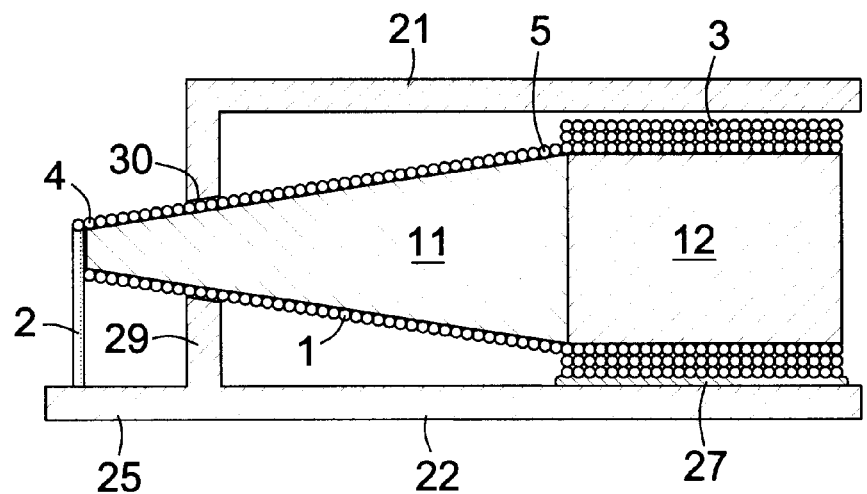
FIG. 3 is a top sectional view of the choke of FIG. 1 taken along the coil axis.

D. Displacement of large end of coil from mounting plane of carrier
1. Wire coil or inductor
2. First lead of coil
3. Second lead of coil
4. Small end of coil
5. Large end of coil
6. Cylindrical extension of coil
7. Bonding of first lead to micro-strip center conductor on circuit board
11. Powdered iron core
12. Ferrite core
15. Substrate of circuit board
16. Ground plate of circuit board
17. Micro-strip contact of circuit board
18. Ground electrode of circuit board
21. Carrier
22. First wall of carrier
23. Holding portion for first lead
24. Plastic weld for holding lead
25. Outrigger for first lead
26. Holding portion for second lead
27. Adhesive stripe for fixing coil to carrier

REFERENCE NUMBERS

28. Mounting plane of carrier
29. Second wall of carrier
30. Coil positioning gap
31. Stub of outrigger after removal
32. Carrier mounting epoxy

TERMINOLOGY

Mounting Plane of Carrier

This is the plane of the electrical contact surfaces on which the carrier is mounted. The mounting plane of the carrier is not necessarily enclosed by the carrier, but may be defined by a common cut-off plane along the bottom of the wall or walls of the carrier.

Hot

The small end of the coil is the high-frequency, or "hot", end of the coil. Thus, the "hot" lead is the first lead, or the lead from the small end of the coil. The "cold" or grounded end is the large end of the coil.

DETAILED DESCRIPTION

A microwave choke is a coil of electrically conductive wire that prevents radio frequency energy from passing through it over a range of frequencies. The invention is a microwave choke with flat performance to less than 0.15 DB maximum insertion loss and over 20 DB of return loss from 300 kHz to 40 GHz. The choke is usable above 40 GHz. It utilizes a plastic enclosure or carrier that does not substantially degrade its electrical performance. It is easily handled and positioned with automatic equipment for accurate placement, resulting in optimum performance.

The device uses specially prepared insulated wire with the insulation removed at the ends. The lead 2 at the small end 4 of the coil should be free of insulation to within a distance from the first winding of the coil of no greater than twice the inner diameter of the small end of the coil, so that the lead length is minimal for the highest frequency operation. Only the uninsulated ends or leads 2 and 3 of the wire are plated with tin, solder, or preferably gold. Gold plating has a nickel under-plate to prevent copper migration through the gold. Gold plating permits the leads to be either gap welded or thermosonically gold wire bonded to gold pads.

The use of plating only on the leads of the wire permits the main body of the inductor to have the extra strength and lower skin resistance of copper while permitting the leads to be bonded using exotic materials such as gold or special epoxies. This gives superior performance over fully gold plated and insulated copper wire and is more economical to manufacture.

Figure 7:
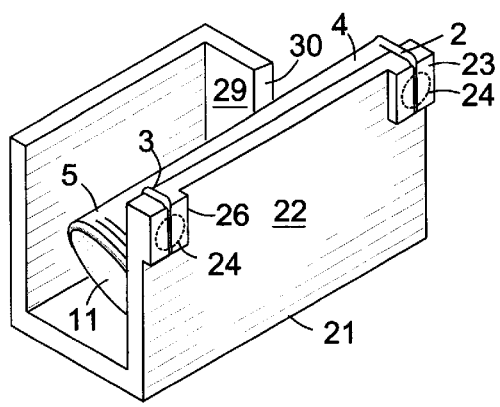
FIG. 7 is a perspective bottom/right/back view of a second embodiment of the choke with a simple conic coil.
Figure 8:
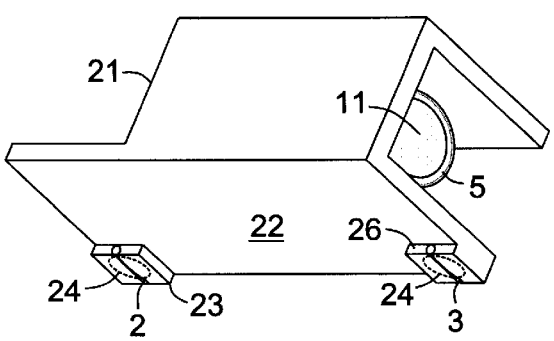
FIG. 8 is a perspective top/right/back view of the choke of FIG. 7.
Figure 9:
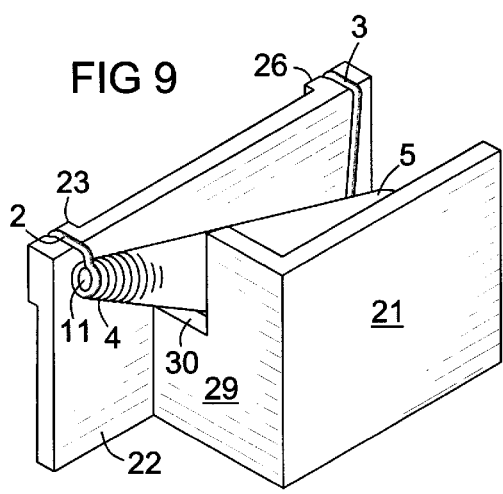
FIG. 9 is a perspective bottom/front/left view of the choke of FIG. 7.
Figure 10:
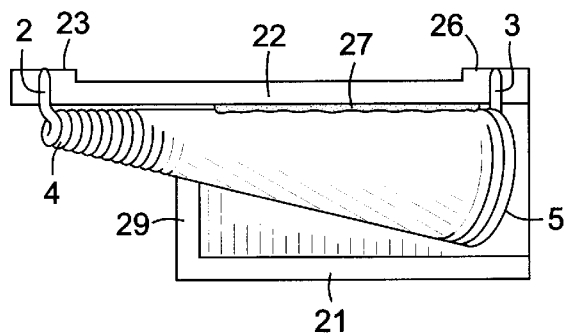
FIG. 10 is a bottom view of the choke of FIG. 7.
Figure 11:
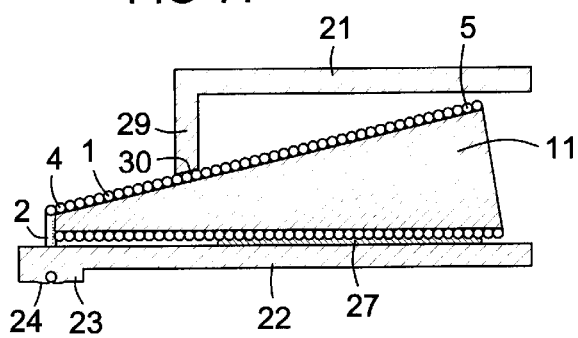
FIG. 11 is a top sectional view of the choke of FIG. 7 along the axis of the coil.
Figure 12:
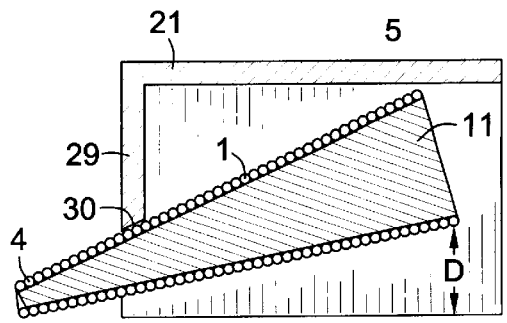
FIG. 12 is a right side sectional view of the choke of FIG. 7 along the axis of the coil.

The carriers shown herein permit the choke to be fully automatically positioned with extreme accuracy onto a micro-strip line. The embodiment of FIGS. 7–12 allows installation by reflow soldering or by the use of conductive epoxy on both leads 2 and 3, but this design has a somewhat reduced frequency response. The reduced response is caused by excessive material present on the small end and an extension of the hot lead along a plane perpendicular to the mounting plane.

Figure 4:
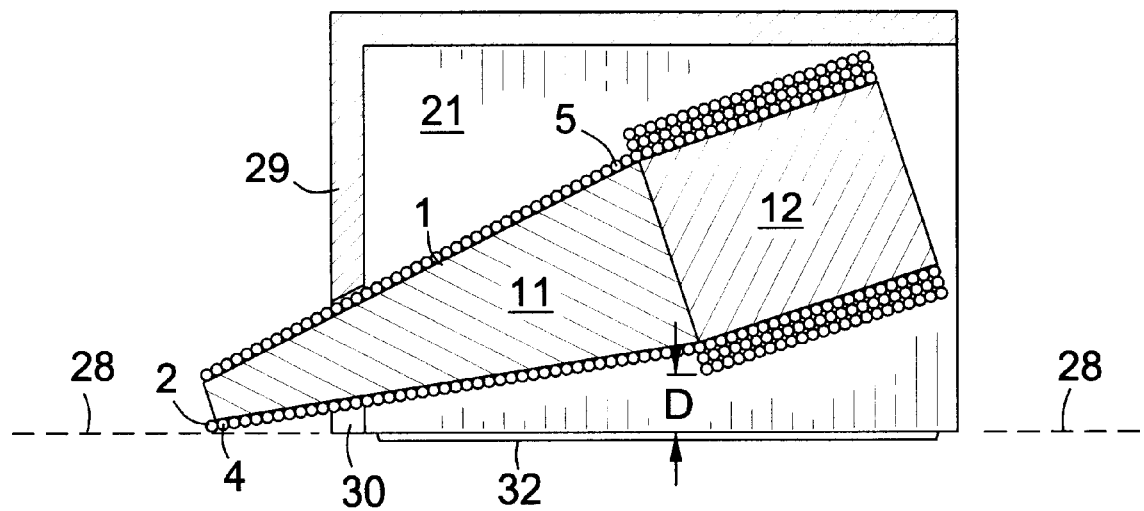
FIG. 4 is a right side sectional view of the choke of FIG. 1 taken along the coil axis.
Figure 5:
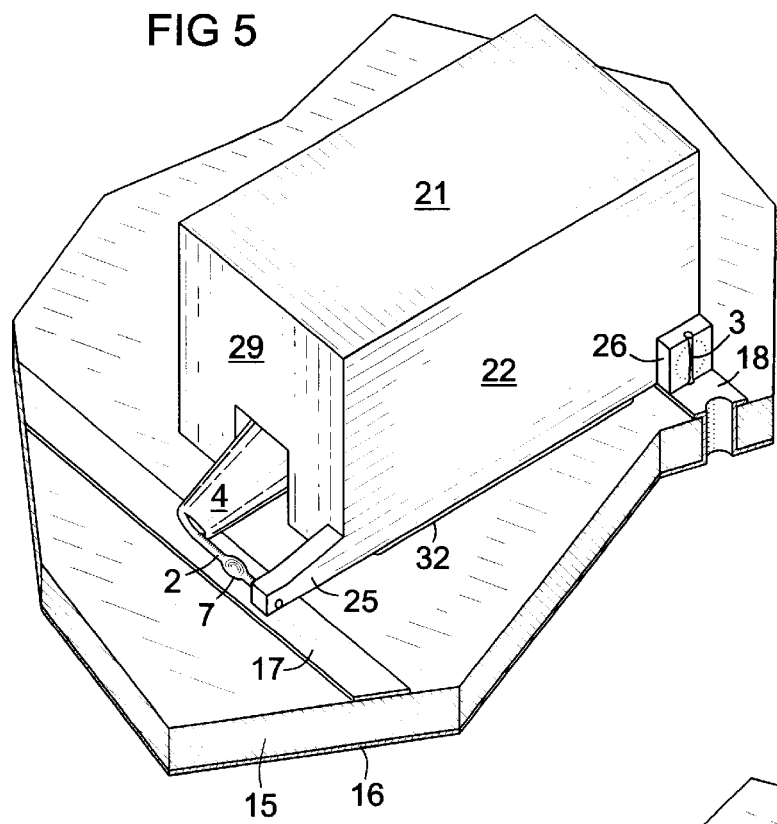
FIG. 5 is a perspective top/right/front view of the choke of FIG. 1 mounted on a circuit board.
Figure 6:
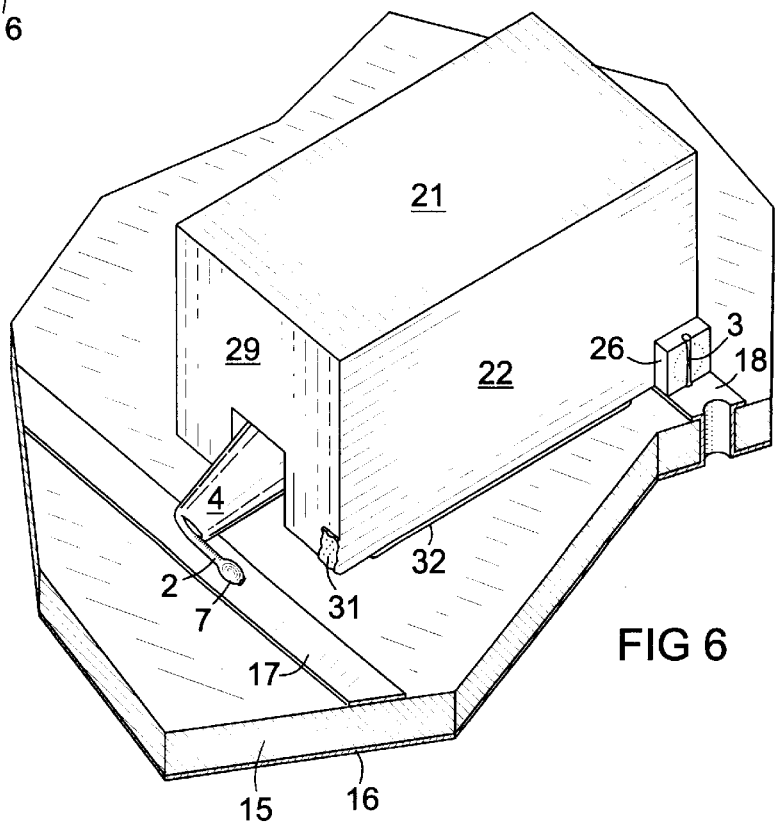
FIG. 6 is a view of FIG. 5, with the outrigger removed.

The preferred embodiment of FIGS. 1–6 allows installation of the low potential end 3 by reflow soldering or conductive epoxy but permits the high potential end 2 to be attached by gap welding or ultrasonic bonding. All excess material applied to the high potential end is eliminated when this end is bonded without the use of solder or epoxy.

The carrier 21 is preferably made of high-temperature thermoplastic with low radio frequency loss that is resistant to solder heat. The coil 1 is attached inside of the enclosure by a stripe of epoxy 27. The epoxy stripe does not extend to the small end 4 of the inductor, which is electrically sensitive. The epoxy stripe should not approach the first winding of the coil to within a distance of three inner diameters of the small end of the coil. This end of the coil is free of excess material of any type since any excess material near this end will degrade performance.

The leads 2 and 3 are precisely positioned on the carrier by grooves in lead-holding areas 23 and 26 on the carrier, and are then plastic-welded into position. The carrier plastic is deformed and surrounds the leads by a heated spot welding tip that locks the lead within the plastic 24. This eliminates the n ee d for any metallic parts on the carrier.

The carrier preferably has an asymmetric shape. This enables orientation by a vibratory feed mechanism that presents a properly oriented choke to a vacuum pickup for positioning. The vacuum pickup places the choke in its exact final location on a circuit. This process is referenced in the electronic industry as "pick and place". The carrier dimensions preferably are repeatable to better than 0.0005 inch by fabrication in a high precision mold. High carrier accuracy allows the chokes to be positioned to plus or minus 0.001", which is often necessary for repeatable performance. The carrier walls are preferably about 0.007 inch thick, which is about twice as thick as a sheet of paper. Alternately, the carrier preferably has a typical wall thickness no greater than the interior diameter of the small end of the coil.

The carrier supports the inductor, and positions it at an oblique angle to the mounting plane 28 of the carrier, and thus to the micro-strip line 17 when installed. This angle should be such that the small end 4 of the coil is nearly tangent to the mounting plane 28 of the carrier. The small end of the coil is preferably separated from the mounting plane of the carrier by less than ½ of the inner radius of the small end of the coil. The first lead 2 preferably reaches the mounting plane of the carrier within a distance from the first winding of less than one radius of the small end of the coil. The large end of the coil 5 should be separated from the mounting plane by a distance D of at least half the radius of the large end of the coil. The angle of the coil relative to the mounting plane reduces stray capacitance and is necessary for controlled and repeatable optimum performance.

The leads are placed so they are underneath the outside edges of the enclosure but are secured by plastic welding to an outside wall of the enclosure. This unique geometry minimizes the dielectric loss effect of the enclosure material on the electrical characteristics of the coil. Conventional components have a metallic pad on a top surface of a carrier or enclosure, and leads are attached to this pad. This causes dielectric properties of the carrier to reduce the performance of the component, and causes excessive stray capacitance inherent in the large area geometry of a conventional contact pad. On some components, a lead is attached to a bottom surface of a pad, but the pad is generally large and introduces considerable stray capacitance and dielectric loss. The ultra thin walls of the present carrier have negligible mass and negligible stray effects. The total absence of a conventional metal bonding pad eliminates stray effects associated with conventional designs. Since the ends of the leads in the present design are plastic-welded into the walls of the carrier, no conductive material is added to make a large bonding pad. The wire is thus bonded to the micro strip with less than one tenth of the area of the smallest conventional bonding pad. The first lead 2 is preferably bonded to the micro strip at a distance from the first winding of the coil no greater than twice the inner diameter of the small end of the coil. The result is unusually high frequency response and unique performance.

Several features permit the present choke to have such a wide frequency range. Although some of these features have been used singly in previous designs, it is the use of all in combination, along with critical placement and proper installation, which extend the useable frequency by several orders of magnitude. These are:

1. The use of a conic coil that is critically placed on a micro-strip.
2. The small end of the conic coil having an extremely small diameter.
3. The use of a powdered iron filler with an extremely small amount of binder.
4. The placement of this filler so that it does not extend externally beyond the small first winding of the coil.
5. The absence of magnetic material on the outside of the small end of the coil.
6. The removal of insulation from the wire very close to the small end of the coil so that the lead length is minimal for the highest frequency operation.
7. Placement of the fine wire lead on the small end of the coil along the exact center of the micro-strip with no extra mass of connection that would add stray capacitance and discontinuity effects due to a geometry change in the conductor.

The wire lead 2 is preferably bonded to the micro-strip 17 by gap welding, which adds no extra material to cause abrupt geometry changes that result in standing waves. Gap welding fuses the gold plated wire lead 2 into the metal of the micro-strip 17 without additional bonding material, thus providing reduced bond size and a smoother transition. Additionally, it provides a gold-to-gold bond, which is more reliable and withstands higher temperatures. The micro-strip 17 typically has a 0.010" wide trace on top of a dielectric substrate 15 with a conductive ground plate 16 on the bottom of the substrate. Conventional components contain metallic bonding pads that are typically at least 0.010" square and do not align perfectly with the micro-strip. This results in reflections of energy and reduced performance over the frequency range. The carrier is secured to the circuit board with non-conductive epoxy 32 in areas away from the leads.

The low frequency range of the device can be extended by providing a cylindrical extension 6 integrally formed on the large end of the conic inductor. This extension is filled with a ferrite rod. Plural layers of wire are wound directly over the ferrite portion of the core. This technique substantially increases the overall inductance in the low frequency range, but does not reduce the effectiveness of the device at high microwave frequencies. In all prior inductive choke designs, increasing the inductance causes degradation in performance at high frequencies. A coiled wire shell with one end in a conic shape and the other in a cylindrical shape produces a broadband choke with relatively flat frequency response characteristics.

A difficulty with fabricating and handling microwave chokes is that they use very fine wire. The wire can be half the diameter of a human hair, or from about 0.0008 to 0.0015 inch in diameter. This makes them extremely fragile. It is difficult to place the device accurately in a circuit. However, placement is critical to optimum performance. A placement error of 0.001 inch will cause a measurable degradation in performance.

The main design considerations for which geometry of the choke should be selected are 1) the physical size limitations of the choke; and 2) the current carrying capacity requirements. There are tradeoffs in construction. Current carrying capacity is determined by the wire diameter, but larger wire makes the device physically larger and reduces its high frequency range. Reducing the diameter of the small end of the coil causes the choke to block higher frequencies. Raising inductance at the large end of the coil by including a cylindrical portion improves blocking of lower frequencies.

For example, when the wire is #36 gauge (AWG), and the small end of the coil is 0.016" I.D., the device will operate up to about 12 GHZ with about 600 ma current capacity. When the wire is #47 AWG, and the small end of the coil is 0.005" I.D., the device will operate up to about 40 Ghz with about 100 ma of current capacity. The angle of the coil relative to the surface of the circuit board effects the high frequency performance. Up to 12 Ghz the coil can rest on the circuit board with little effect. Above 12 Ghz the high frequency response improves if the coil is set at an angle to the circuit board. This is accomplished by mounting the large end of the coil above the mounting plane 28 of the carrier by a distance D of at least half the inner radius of the large end of the coil or more, depending on physical space available and bandwidth desired.

The cylindrical part of the coil preferably has 3 layers. This provides high inductance in a shorter cylindrical coil length as compared to a single layer. Preferably the cylindrical extension is approximately half the length of the conic coil. The use of two layers in the cylindrical extension is not recommended, because it lowers the self-resonant frequency of the coil. Any odd number of layers from 3 and up are best. Use of multiple layers on the small end of the coil is not recommended because it reduces the high frequency response.

It has been previously impossible to use a leadless carrier for many types of microwave circuits because the carrier took valuable space on the center of the micro-strip required by adjacent components. Additionally, degradation in microwave performance resulted from the use of prior carrier geometries. This is solved in the present invention by providing a removable outrigger 28 that holds the lead 2 from the small end 4 of the coil for precise placement with gap welding.

After conductively bonding the leads 2 and 3 to the circuit board contacts 17 and 18 respectively, the outrigger 25 can be snapped off. If the conductive weld 7 of the first lead 2 to the micro-strip is made properly, the wire breaks just beyond the weld (FIGS. 5 and 6), leaving the weld intact. Removing the outrigger eliminates stray electromagnetic effects caused by it and the extension of the wire beyond the weld to the outrigger. The outrigger can be snapped off with tweezers using a twisting motion, and the wire will break off just beyond the weld. In microelectronic component assembly it is a customary procedure to pull off the "pigtail" (wire extending beyond a weld) since pulling of the pigtail is the most common test for a good weld. By removing the outrigger and pulling the excess wire off, the integrity of the weld is tested while simultaneously improving the microwave performance of the device. Additionally, the valuable space occupied by the outrigger can then be used for mounting other components on the micro-strip.

The carrier is shown as box-like, but it can optionally be other shapes, including smoothly curved shapes. It can have flat sides angled to follow the conic sides of the coil, appearing trapezoidal in a top view. In any case, it preferably has at least a flat top and an asymmetric shape to enable automatic handling.

Although the present invention has been described herein with respect to preferred embodiments, it will be understood that the foregoing description is intended to be illustrative, not restrictive. Modifications of the present invention will occur to those skilled in the art. All such modifications that fall within the scope of the appended claims are intended to be within the scope and spirit of the present invention.

I claim:

1. A microwave choke comprising:
   an electrically conductive wire having first and second ends;
   the wire wound into a hollow conic coil, the coil having a small end and a large end, a first winding of the wire at the small end of the coil, the small and large ends of the coil having inner and outer diameters and radii;
   the first and second ends of the wire extending as first and second leads from the small and large ends of the coil respectively;
   a coating of electrical insulation on the wire except on the leads;
   the first lead being free of insulation to within a distance from the first winding of the coil of no greater than twice the inner diameter of the small end of the coil;
   the coil filled with a core of powdered iron bound with an adhesive binder;
   the core not extending externally from the small end of the coil.

2. The microwave choke of claim 1, further comprising a cylindrical extension on the large end of the coil, the cylindrical extension made of additional windings of the wire, the wire being continuous from the first end of the wire to the small end of the conic coil to the large end of the coil to the cylindrical extension to the second end of the wire, and wherein the cylindrical extension has an interior filled with ferrite.

3. The microwave choke of claim 2, wherein the conic coil has only one layer of windings of the wire, and the cylindrical extension comprises multiple layers of windings of the wire.

4. The microwave choke of claim 3, wherein the cylindrical extension is approximately half the length of the conic coil, and has 3 layers of windings.

5. The microwave choke of claim 1 further comprising:
   a carrier made of electrically insulating material, the carrier having a mounting plane; the wire coil mounted in the carrier;
   the carrier shaped to hold the outer circumference of the small end of the coil separated from the mounting plane of the carrier by less than ½ of the inner radius of the small end of the coil;
   each of the two leads of the coil extending to the mounting plane of the carrier; and
   the first lead reaching the mounting plane of the carrier within a distance from the first winding of less than one radius of the small end of the coil.

6. The microwave choke of claim 5, wherein the carrier holds the large end of the coil displaced from the mounting plane of the carrier by at least a distance of ½ the inner radius of the large end of the coil;

7. The microwave choke of claim 5, wherein the carrier is shaped to hold the outer circumference of the small end of the coil approximately tangent to the mounting plane of the carrier, and the first lead extends approximately tangentially from the small end of the coil along the mounting plane of the carrier.

8. The microwave choke of claim 5, wherein the carrier further comprises an outrigger arm extending beside the small end of the coil along the mounting plane of the carrier, the first end of the wire is fixed to the arm, and the first lead spans between the small end of the coil and the arm along the mounting plane of the carrier.

9. The microwave choke of claim 5, wherein the carrier has a typical wall thickness no greater than the interior diameter of the small end of the coil.

10. The microwave choke of claim 5, wherein the exterior of the carrier is physically asymmetric; whereby the carrier can be physically oriented by a machine.

11. The microwave choke of claim 5, wherein at least the first lead is fixed to the carrier by electrically non-conductive means.

12. The microwave choke of claim 11, wherein at least the first lead is affixed to the carrier by melting the carrier material at a point of contact of the first lead on the carrier.

13. The microwave choke of claim 5, whereby the coil is affixed to the carrier by non-conductive adhesion means that does not approach the first winding to within a distance of three inner diameters of the small end of the coil, whereby the small end of the coil is free of material which could add stray capacitance and other unwanted effects.

14. A microwave choke comprising:
   an electrically conductive wire having first and second ends;
   the wire wound into a hollow conic coil, the coil having a small end, a large end, a first winding of the wire at the small end of the coil, the small and large ends of the coil having inner and outer diameters and radii;
   the first and second ends of the wire extending as first and second leads from the small and large ends of the coil respectively;
   a coating of electrical insulation on the wire except on the leads;
   the first lead being free of insulation to within a distance from the first winding of the coil of no greater than twice the inner diameter of the small end of the coil;
   the coil filled with a core of powdered iron bound with an adhesive binder;
   the core not extending externally from the small end of the coil;
   a carrier made completely of electrically non-conductive material;
   the wire coil mounted in the carrier with electrically non-conductive adhesive material;
   a circuit board having first and second electrical contacts separated from each other by approximately the same distance as the separation between the first and second leads of the coil;
   the first lead bonded to the first contact at a distance from the first winding of the coil no greater than twice the inner diameter of the small end of the coil; and
   the second lead bonded to the second contact.

15. The microwave choke of claim 14, further comprising a cylindrical extension on the large end of the coil, the cylindrical extension made of additional windings of the wire, the wire being continuous from the first end of the wire to the small end of the conic coil to the large end of the coil to the cylindrical extension to the second end of the wire, and wherein the cylindrical extension has an interior filled with ferrite.

16. The microwave choke of claim 15, wherein the conic coil has only one layer of windings of the wire, and the cylindrical extension has multiple layers of windings of the wire.

17. The microwave choke of claim 16, wherein the cylindrical extension is approximately half the length of the conic coil, and has 3 layers of windings.

18. A method for attaching a microwave choke to a circuit board, comprising the steps of:
   a. providing electrically conductive wire wound into a hollow conic coil having a length, the coil having small and large ends with respective inner diameters, the wire having first and second ends extending as first and second leads from the small and large ends of the coil respectively;
   b. providing a carrier of electrically insulating material with a typical wall thickness no greater than twice the inner diameter of the small end of the coil;
   c. mounting the coil in the carrier using electrically non-conductive adhesive material that does not approach the small end of the coil within a distance of three inner diameters of the small end of the coil;
   d. providing a circuit board with first and second electrical contacts separated by approximately the length of the coil;
   e. bonding the first lead of the coil conductively to the first contact of the circuit board within a distance from the small end of the coil no greater than twice the inner diameter of the small end of the coil; and
   f. bonding the second lead of the coil conductively to the second contact of the circuit board.

* * * * *